US011933868B2

United States Patent
Nistler et al.

(10) Patent No.: US 11,933,868 B2
(45) Date of Patent: Mar. 19, 2024

(54) METHOD AND APPARATUS FOR INTERFERENCE SUPPRESSION FOR MR WHOLE BODY ANTENNAS

(71) Applicant: Siemens Healthcare GmbH, Erlangen (DE)

(72) Inventors: Jürgen Nistler, Erlangen (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/519,563

(22) Filed: Nov. 4, 2021

(65) Prior Publication Data

US 2022/0137168 A1    May 5, 2022

(30) Foreign Application Priority Data

Nov. 5, 2020    (DE) ...................... 10 2020 213 938.5

(51) Int. Cl.
*G01R 33/422*    (2006.01)
(52) U.S. Cl.
CPC .................................. *G01R 33/422* (2013.01)
(58) Field of Classification Search
CPC .................................................. G01R 33/422
See application file for complete search history.

(56) References Cited

U.S. PATENT DOCUMENTS

| 5,367,261 | A | * | 11/1994 | Frederick | ............. | G01R 33/422 |
| | | | | | | 324/318 |
| 5,453,692 | A | * | 9/1995 | Takahashi | .......... | G01R 33/3415 |
| | | | | | | 324/318 |
| 6,420,873 | B1 | * | 7/2002 | Guthrie | ................. | G01R 33/56 |
| | | | | | | 324/318 |
| 10,806,367 | B2 | * | 10/2020 | Breeuwer | ............. | A61B 5/026 |
| 2002/0084782 | A1 | * | 7/2002 | Guthrie | ............. | G01R 33/3621 |
| | | | | | | 324/307 |
| 2010/0253333 | A1 | * | 10/2010 | Zhai | ................. | G01R 33/34076 |
| | | | | | | 324/318 |

(Continued)

FOREIGN PATENT DOCUMENTS

| DE | 102020211606 A1 | 3/2022 |
| EP | 3467531 A1 | 4/2019 |
| WO | 2019068687 A2 | 4/2019 |

OTHER PUBLICATIONS

German Office Action for German Application No. 10 2020 213 938.5 dated Aug. 12, 2021.

*Primary Examiner* — Dixomara Vargas
(74) *Attorney, Agent, or Firm* — Lempia Summerfield Katz LLC

(57) ABSTRACT

A magnetic resonance tomography system that includes a transmitter for generating an excitation signal and a body coil for emitting the excitation signal, and a method for operation of the magnetic resonance tomography system are provided. The magnetic resonance tomography system has a patient tunnel, in which the body coil is arranged. The magnetic resonance tomography system also has a first transmission interference suppression antenna that is arranged between the body coil and an opening in the patient tunnel. The first transmission interference suppression antenna is configured to provide a spatial transmission characteristic that may be compared with the body coil.

19 Claims, 5 Drawing Sheets

(56) References Cited

U.S. PATENT DOCUMENTS

| | | | | |
|---|---|---|---|---|
| 2011/0074415 | A1* | 3/2011 | Chu | G01R 33/3415 |
| | | | | 324/309 |
| 2011/0074425 | A1* | 3/2011 | Chu | G01R 33/365 |
| | | | | 324/322 |
| 2014/0070810 | A1* | 3/2014 | Robert | G01R 33/441 |
| | | | | 324/322 |
| 2014/0247050 | A1* | 9/2014 | Tomiha | G01R 33/3657 |
| | | | | 324/322 |
| 2018/0364322 | A1* | 12/2018 | Eberler | H01Q 7/00 |
| 2019/0137579 | A1* | 5/2019 | Fukushima | G01R 33/34076 |
| 2020/0041587 | A1* | 2/2020 | Findeklkee | G01R 33/3664 |
| 2020/0249292 | A1* | 8/2020 | Biber | G01R 33/3692 |
| 2020/0284861 | A1* | 9/2020 | Srinivasan | G01R 33/422 |
| 2021/0025954 | A1* | 1/2021 | Biber | G01R 33/3621 |
| 2021/0146158 | A1* | 5/2021 | Wirtz | G01R 33/4814 |
| 2022/0018919 | A1* | 1/2022 | Grodzki | G01R 33/3614 |
| 2022/0082642 | A1* | 3/2022 | Biber | G01R 33/34038 |
| 2022/0091203 | A1* | 3/2022 | Yang | G01R 33/365 |
| 2022/0291310 | A1* | 9/2022 | Nistler | G01R 33/583 |

* cited by examiner

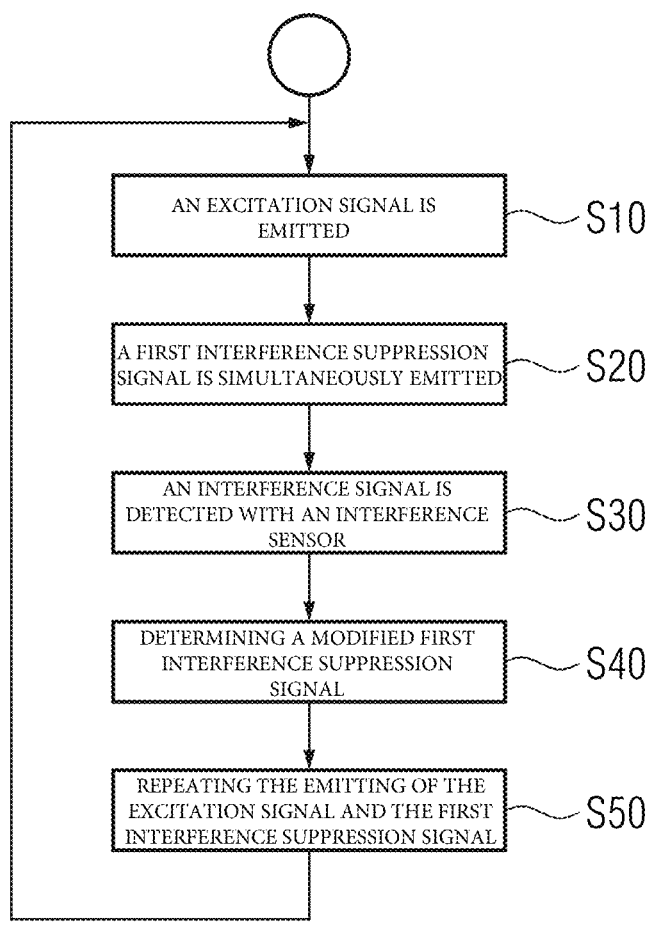

METHOD AND APPARATUS FOR INTERFERENCE SUPPRESSION FOR MR WHOLE BODY ANTENNAS

This application claims the benefit of German Patent Application Number DE 10 2020 213 938.5, filed on Nov. 5, 2020, which is hereby incorporated by reference in its entirety.

BACKGROUND

The present embodiments relate to a magnetic resonance tomography system with a transmitter for generating an excitation signal and a body coil for emitting the excitation signal in a patient tunnel with a body coil.

Magnetic resonance tomography systems are imaging apparatuses that, in order to image an examination object, align nuclear spins of the examination object with a strong external magnetic field and excite these to precession about this alignment using an alternating magnetic field. The precession or return of the spins from this excited state into a state with lower energy in turn produces, as a response, an alternating magnetic field, which is received via antennas.

With the aid of magnetic gradient fields, a spatial encoding is impressed onto the signals, which then enables an assignment of the received signal to a volume element. The received signal is then evaluated and provides a three-dimensional imaging representation of the examination object. In order to receive the signal, local receive antennas (e.g., local coils) that are arranged directly on the examination object in order to achieve an improved signal-to-noise ratio may be used. The receive antennas may also be installed in a patient couch.

Magnetic resonance tomography systems use a radio frequency shielding in two respects. First, radio frequency pulses with outputs in the kilowatt range that are only partially absorbed in the patient are produced in order to excite the nuclear spins. Radio waves that leave the patient aperture are irradiated into the room and are therefore to be shielded in order to retain emission limit values.

Conversely, the magnetic resonance signals to be received for the imaging are extremely weak. In order here to achieve an adequate signal-to-noise ratio (SNR), a shielding of an external interference signal is to be provided.

Therefore, in the prior art, expensive shielding cabins are installed about a magnetic resonance tomography system in order to reduce both emissions and also immissions.

A magnetic resonance tomography system with an active interference suppression and a method for operation are known from the publication WO 2019/06867 A2.

With apparatuses of this type, it is problematic to achieve a stable interference suppression with different interference influences.

SUMMARY AND DESCRIPTION

The scope of the present invention is defined solely by the appended claims and is not affected to any degree by the statements within this summary.

The present embodiments may obviate one or more of the drawbacks or limitations in the related art. For example, interference suppression is improved.

A magnetic resonance tomography system includes a transmitter for generating an excitation signal and a body coil for emitting the excitation signal. The magnetic resonance tomography system also includes a patient tunnel, in which the body coil is arranged. A patient tunnel is considered to be an electrically conducting boundary around the patient that surrounds the patient during the examination in at least two different spatial directions and also prevents or restricts an irradiation of an excitation signal in these directions. The patient tunnel is typically a cylinder or prism that extends horizontally along the $B_z$- or B0-field direction of the field magnet of the magnetic resonance tomography system. In one embodiment, the patient tunnel laterally has an opening for a therapeutic access (e.g., during a radiation therapy, a biopsy, or suchlike). A vertical alignment of the field magnet may also be provided, so that the patient is accessible from one or more directions in a horizontal plane and poles of the field magnet form the patient tunnel at least partially as an upper and lower boundary, for example.

A body coil may be an antenna that surrounds the body or a body part at least partially and is configured to excite nuclear spins in the body or the body part by the excitation signal. In many magnetic resonance tomography systems, the patient tunnel is configured as a cylinder or prism that is located in a cavity of a superconducting field magnet, in which a "bird cage" antenna is located as a body coil, for example. Depending on the magnetized field strength and Larmor frequency and associated wavelengths resulting therefrom, other body coils may also be provided (e.g., from matrices of magnetic or electrical individual antennas). The external contour of the body coil is typically adjusted to the contour of the patient tunnel, so that the largest possible free clearance is available to the patient in the interior of the body coil.

Further, the magnetic resonance tomography system has a first transmission interference suppression antenna. A transmission interference suppression antenna may be an antenna, by way of which an interference suppression signal may be emitted, so that a radio frequency signal resulting from the excitation signal and the interference suppression signal with less energy and field strength than without the interference suppression signal is irradiated out of the opening of the patient tunnel. The reduction is carried out by a destructive interference of both signals. The first transmission interference suppression antenna is arranged between, for example, the body coil and the opening of the patient tunnel.

The first transmission interference suppression antenna is configured to provide a spatial transmission characteristic that may be compared with the body coil. A spatial transmission characteristic is considered to be, for example, a spatial distribution of the electromagnetic fields irradiated by the antenna. The spatial transmission characteristic may be distinguished, for example, by symmetries (e.g., a mirror symmetry in relation to a plane, an axis, or a point; a rotational symmetry about an axis or a point). For example, a bird cage antenna has an axis of symmetry in the center of the cylinder embodied thereby and is rotationally symmetrical to this axis. A bird cage antenna with 8 conductor rods is, for example, rotationally symmetrical for rotations about n*360/8 degrees with n as a natural number. The spatial transmission characteristic may, for example, also include a polarization of the emitted electromagnetic fields.

In one embodiment, a transmission interference suppression antenna with a spatial transmission characteristic that may be compared, with the body coil, with an interference suppression signal that is derived from the excitation signal, enables a field distribution that, in a large space in front of the opening, is to achieve a greatest possible cancellation of the excitation signal by destructive interference, to be generated. This is due to the fields irradiated by the transmission interference suppression antenna extending with essentially the same symmetry and drop in intensity in the surrounding room.

In one embodiment of the magnetic resonance tomography system, the magnetic resonance tomography system has a further, second transmission interference suppression antenna. The second transmission interference suppression antenna may have a spatial transmission characteristic that may be compared with the first transmission interference suppression antenna (e.g., if the patient tunnel has a second opening and the first transmission interference suppression antenna and the second transmission interference suppression antenna are arranged in symmetry with the body coil and the openings). The body coil is arranged along, for example, a longitudinal axis of the patient tunnel between the first transmission interference suppression antenna and the second transmission interference suppression antenna.

The second transmission interference antenna may enable a reduction in the irradiation from both openings of the patient tunnel.

In one embodiment of the magnetic resonance tomography system, the first transmission interference suppression antenna and the body coil are of the same type. Both antennas have a similar geometry or symmetry and/or are emitters according to the same functional principle. For example, both the body coil and the first transmission interference suppression antenna may be bird cage antennas. Both the transmission interference suppression antenna and the body coil may then have the same number of emitter elements or rods. The same also applies to body coils or transmission interference suppression antennas, which have a different design.

By using transmission interference suppression antennas of the same type, a similar distribution of the irradiated fields is also easily provided.

In one embodiment of the magnetic resonance tomography system, the first transmission interference suppression antenna and the body coil have shared electrical conductors. In other words, the transmission interference suppression antenna and the body coil are connected directly by one or more electrical conductors. The electrical conductors may also have passive elements such as a capacitance and/or inductance. In one embodiment, these shared conductors may be emitters (e.g., elements) that have a significant part of the irradiation of the antenna. In an embodiment, the first transmission interference suppression antenna and the body coil may be bird cage antennas. The shared conductor element is the end ring of both bird cage antennas.

In one embodiment, it is possible, via the shared conductor elements, to generate the interference suppression signal for the transmission interference suppression antenna directly from the excitation signal. For example, a phase shift may be achieved by the dimensioning of the transmission interference suppression antenna, so that an interference suppression signal with an inverted phase position is emitted by the transmission interference suppression antenna for a destructive interference.

In one embodiment of the magnetic resonance tomography system, the transmitter is configured to control the first transmission interference suppression antenna at a first signal supply with a first interference suppression signal as a function of the excitation signal. For example, the transmitter may have a separate end stage or a distribution network.

A dedicated signal output of the transmitter for the interference suppression signal enables this to be changed in one or more parameters irrespective of the excitation signal.

In one embodiment of the magnetic resonance tomography system, the magnetic resonance tomography system is configured to generate the first interference suppression signal with a predetermined damping and/or phase shift from the excitation signal.

For example, a phase shift and damping may be achieved by a passive network and results in the electromagnetic fields emitted by the body coil and the transmission interference suppression antenna largely canceling themselves out outside of the patient tunnel. In one embodiment, the transmitter may have one or more channels, via which the interference suppression signal is provided accordingly (e.g., by the phase shift and damping being generated by digital signal processing or a signal being synthesized with the desired properties).

In one embodiment, with an interference suppression signal generated by the transmitter, the interference suppression signal in a number of parameters may also be varied between individual sequences, and individual channels may be adjusted independently, in order, for example, to respond to changes in the electromagnetic propagation properties by the patient.

In one embodiment of the magnetic resonance tomography system, the magnetic resonance tomography system has an interference sensor. A sensor or antenna that is configured to record an electromagnetic interference signal (e.g., with the frequency of the excitation signal) is referred to as an interference sensor. This may be, for example, an induction loop or an electrical antenna and may include a preamplifier, filter, or also an analog-digital converter. The interference sensor is arranged outside of the patient tunnel or at least so that the interference sensor is arranged closer to the first transmission interference suppression antenna than to the body coil. The interference sensor may have a signal connection with the transmitter in order to forward a detected interference suppression signal hereto.

The first transmission interference suppression antenna has a second signal supply. The magnetic resonance tomography system is configured to control the first transmission interference suppression antenna via the second signal supply with a second interference suppression signal. The magnetic resonance tomography system is configured to generate the second interference suppression signal as a function of a signal of the interference sensor.

For example, the transmitter or an interference suppression controller of the magnetic resonance tomography system may generate an interference suppression signal from the recorded interference signal by filtering, amplification, and phase shift. The interference suppression signal reduces interference emissions as a result of the excitation signal when transmission occurs via the first and/or second interference suppression antenna. The recorded interference signal may be used in order to detect the intensity of the emitted excitation signal at the site of the interference sensor and to vary the interference suppression signal so that the destructive interference of the interference suppression signal and excitation signal minimizes the intensity of the interference signal at the interference sensor (e.g., according to a linear optimization method, such as LSR).

A suppression sensor enables an adjustment to varying ratios and thus an optimal interference suppression under all circumstances.

In one embodiment of the magnetic resonance tomography system, the magnetic resonance tomography system has a third transmission interference suppression antenna. The third transmission interference suppression antenna has a monopoly characteristic. A characteristic that is similar to an electrical monopole or a rod antenna and conversely to the dipole does not have two inversely phased poles is referred to as a monopoly characteristic. For example, the radiation characteristic is similar to the radiation characteristic that the body of a patient has, which receives the excitation pulse in the inside of the patient tunnel, such as an inner conductor in a hollow conductor and, for example, irradiates via the feet outside of the patient tunnel. The third transmission antenna may be an electrical or capacitive antenna (e.g., generates an electrical alternating field in the near field) in order to be able to compensate for the electrical fields that are emitted by the patient body as a conductor.

The third transmission interference suppression antenna may be arranged in the patient tunnel, but may, however, also be arranged in front of an opening of the patient tunnel, or one in front of each opening, respectively. The above explanations relating to the first noise suppression signal (e.g., the generation by a passive network, active generation, or optimization by means of the interference sensor) apply analogously to the generation of the interference signal.

In one embodiment, the monopoly-type characteristic of the third transmission interference suppression antenna may compensate better for the other type of irradiation of the body than would be possible using the first and/or second transmission interference suppression antenna.

BRIEF DESCRIPTION OF THE DRAWINGS

FIG. 6 shows a schematic flowchart of an embodiment of a method.

DETAILED DESCRIPTION

Figure 1:
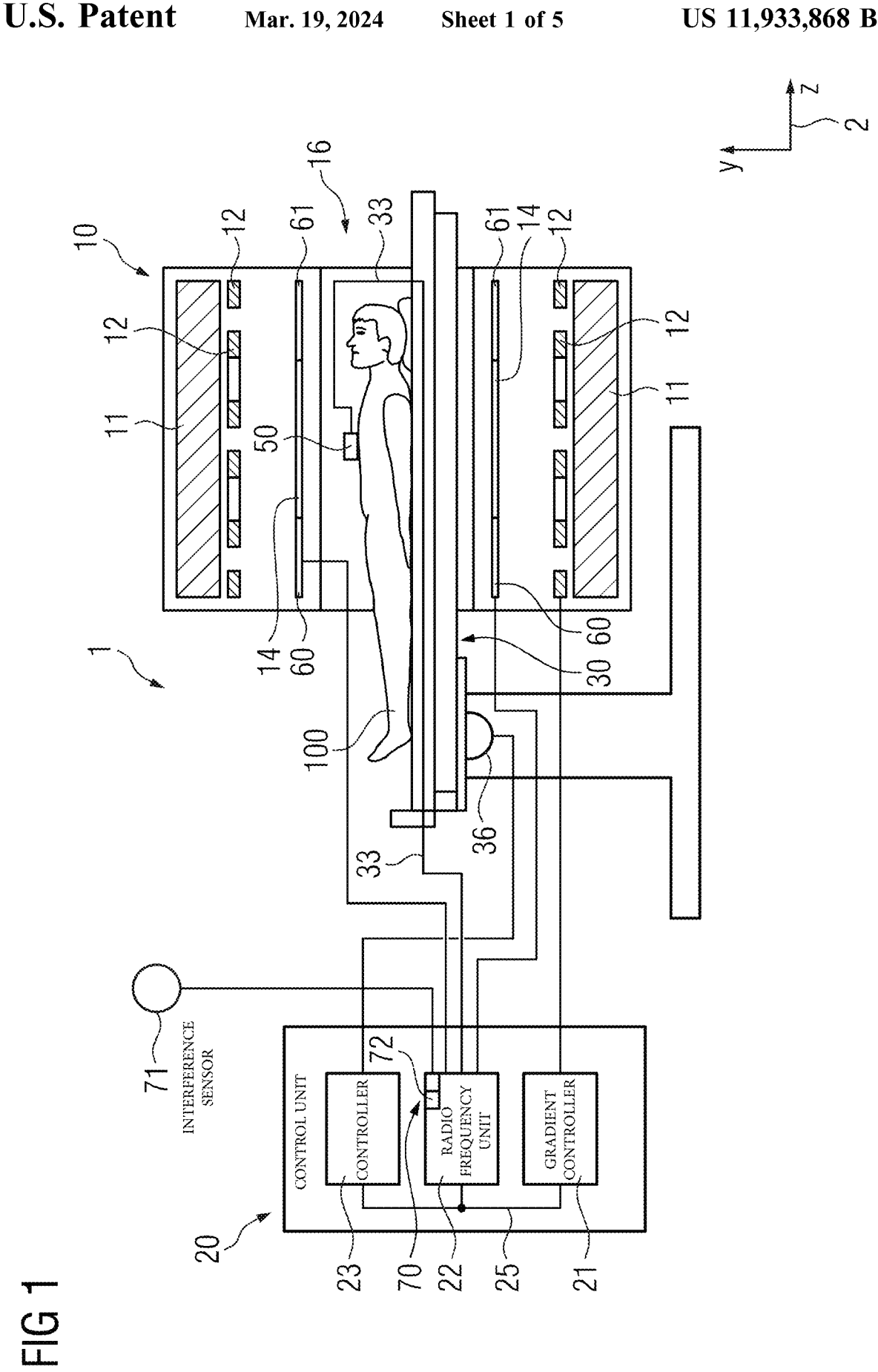
FIG. 1 shows a schematic representation of an embodiment of a magnetic resonance tomography system with a transmission interference suppression antenna.

FIG. 1 shows a schematic representation of an embodiment of a magnetic resonance tomography system 1 with a transmission interference suppression antenna 60.

The magnet unit 10 has a field magnet 11 that generates a static magnetic field B0 in order to align nuclear spins of specimens or the patient 100 in a recording area. The recording area is characterized by an extremely homogenous static magnetic field B0, where the homogeneity relates, for example, to the magnetic field strength or the sum. The recording area is almost spherical and arranged in a patient tunnel 16 that extends in a longitudinal direction 2 through the magnet unit 10. A patient couch 30 may be moved in the patient tunnel 16 by the movement unit 36. The field magnet 11 is typically a superconducting magnet that may provide magnetic fields with a magnetic flux density of up to 3 T, with more recent devices even beyond that. For lower field strengths, however, permanent magnets or electromagnets may also be used with normally conducting coils.

Further, the magnet unit 10 has gradient coils 12 that are configured for spatial differentiation of the detected imaging regions in the examination volume, to overlay the magnetic field B0 with variable magnetic fields in three spatial directions. The gradient coils 12 are typically coils including normally conducting wires that may generate fields that are orthogonal to one another in the examination volume.

The magnet unit 10 likewise has a body coil 14 that is configured to irradiate a radio frequency signal supplied via a signal line into the examination volume and to receive resonance signals emitted by the patient 100 and to output the same via a signal line. The term transmission antenna refers below to an antenna, via which the radio frequency signal is emitted in order to excite the nuclear spins. This may be the body coil 14, but also a local coil 50 with transmission function.

A control unit 20 supplies the magnet unit 10 with the different signals for the gradient coils 12 and the body coils 14 and evaluates the received signals.

The control unit 20 therefore has a gradient controller 21 that is configured to supply the gradient coils 12 via supply lines with variable currents that provide the desired gradient fields in the examination volume in a temporally coordinated manner.

Further, the control unit 20 has a radio frequency unit 22 that is configured to generate a radio frequency pulse with a predetermined temporal course, amplitude, and spectral power distribution in order to excite a magnetic resonance or the nuclear spins in the patient 100. Pulse outputs in the region of kilowatts may be achieved. The excitation signals may be emitted into the patient 100 via the body coil 14 and also via a local transmission antenna.

A controller 23 communicates via a signal bus 25 with the gradient controller 21 and the radio frequency unit 22.

A local coil 50 is arranged on the patient 100 as a first receive antenna. The local coil is connected to the radio frequency unit 22 and a corresponding receiver via a connection line 33. In one embodiment, however, the body coil 14 may be a first receive antenna within the present embodiments.

The magnetic resonance tomography system 1 also has two transmission interference suppression antennas 60, 61 in the patient tunnel. These are arranged in each case between an opening of the patient tunnel 16 and the body coil 14, so that the body coil 14 in the patient tunnel along the longitudinal direction 2 lies between the first transmission interference suppression antenna 60 and the second transmission interference suppression antenna 61. In one embodiment, however, an opening in the patient tunnel 14 may have a shielding mesh, or the patient tunnel 14 may only have one opening. In this case, only a transmission interference suppression antenna 60 is arranged between the body coil 14 and the opening.

The first transmission interference suppression antenna 60 and the second transmission interference suppression antenna 61 may have a comparable transmission characteristic to the body coil 14. The electromagnetic fields that are irradiated by the interference transmission antenna 60, 61 and the body coil 14 during control with the excitation signal and the interference suppression signal have essentially the same spatial distribution and, for example, also phase position, so that over one or more periods, the fields destructively interfere at predetermined locations and essentially cancel themselves out. The predetermined locations may be in the far field of the body coil 14.

In the simplest case, this may be achieved by the transmission interference suppression antenna 60, 61 and the body coil 14 being of the same design (e.g., both bird cage antennas). Further possibilities are explained in relation to the following figures.

One or more interference sensors 71 are outside of the patient tunnel (e.g., at a distance in the far field of the body coil, of greater than a half or a whole wavelength of an electromagnetic wave with the frequency of the excitation signal). The interaction of the interference sensor 71 with the transmission interference suppression antenna or antennas 60, 61, 62 is explained in relation to the following figures.

Figure 2:
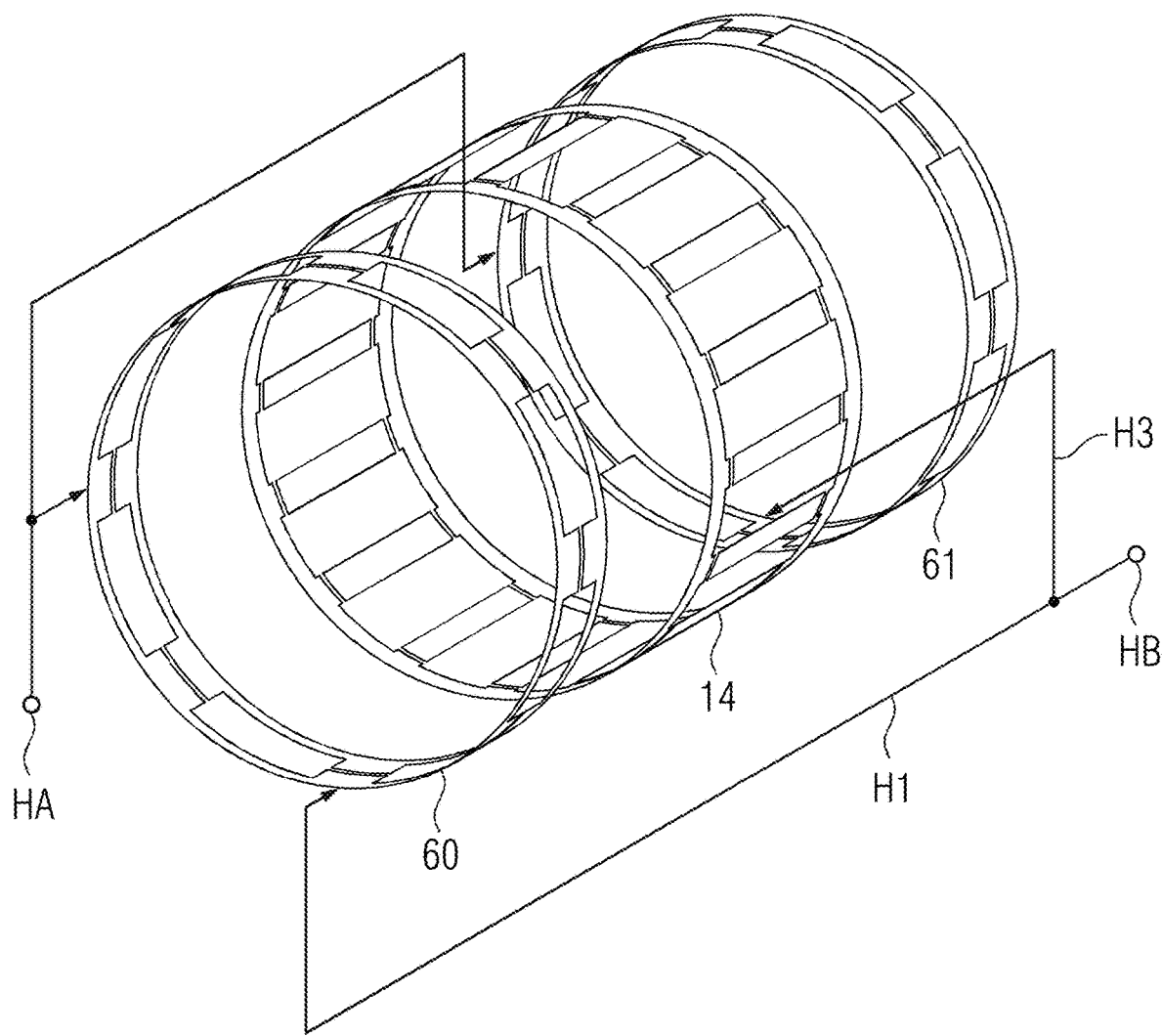
FIG. 2 shows a schematic representation of an embodiment of a body coil, a first transmission interference suppression antenna, and a second transmission interference suppression antenna.

FIG. 2 shows a schematic representation of a possible embodiment of the body coil 14 and the first transmission interference suppression antenna 60 and the second transmission interference suppression antenna 61. The patient tunnel 16 and other elements of the magnetic resonance tomography system 1 of the present embodiments are not shown for the sake of clarity.

Both the body coil 14 and the transmission interference suppression antennas 60, 61 are configured as, for example, bird cage antennas, in which two end rings are connected in the longitudinal direction 2 by conductor rods. In one embodiment, the conductor rods may have interruptions, to which capacitances or inductances are inserted, in order to, for example, increase or reduce the electrical length for a radio frequency signal and/or to bring about a phase shift of the radio frequency signal.

Two signal supplies are referred to with HA and HB, which supply the transmission interference suppression antennas 60, 61 with a first interference suppression signal and a second interference suppression signal. In the embodiment shown in FIG. 2, feed points, at which the interference suppression signal is supplied, are provided in a position rotated by 90 degrees about the longitudinal direction 2, so that with a second interference suppression signal, which is phase shifted by 90 degrees compared with the first interference suppression signal, a circularly polarized field is generated by the transmission interference suppression antennas 60, 61. This field corresponds to a circularly polarized field produced by the body coil 14 and may, with a corresponding identical frequency, attenuate suitable phase position and amplitude of the electromagnetic field irradiated by the body coil 14 along the longitudinal direction 2 outside of the patient tunnel as a result of destructive interference.

The control of the body coil 14 with the excitation signal is not shown. This may take place accordingly, for example, by two excitation signals with a 90-degree phase shift relative to one another being fed in at two feed points opposite the feed points of the transmission interference suppression antennas 60, 61. In one embodiment, however, the body coil 14 may be fed with a larger number of feed points that are offset with respect to one another and a corresponding number of excitation signals.

The individual interference suppression signals and excitation signals may be produced by separate radio frequency stages that offer more degrees of freedom during the excitation and interference suppression. In one embodiment, however, the excitation signals and/or interference suppression signals may be derived from a single signal by passive means such as a distribution network.

Figure 3:
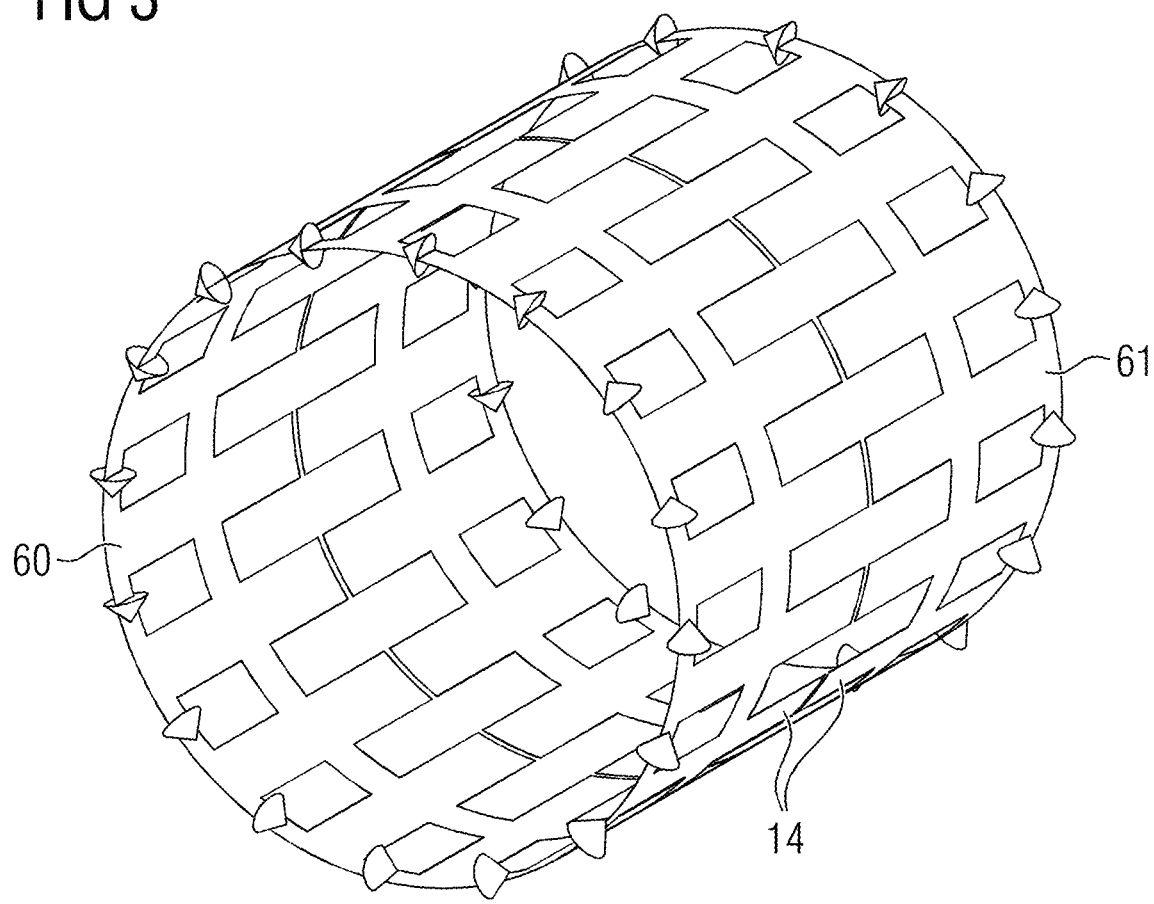
FIG. 3 shows a schematic representation of an embodiment of the body coil, the first transmission interference suppression antenna, and the second transmission interference suppression antenna.

A special embodiment of a passive generation of the excitation signals of this type is shown in FIG. 3.

In FIG. 3, the transmission interference suppression antennas 60, 61 and the body coil 14 are coupled directly electrically and mechanically by the end rings of the body coil 14 simultaneously being the end ring of the adjoining transmission interference suppression antenna 60, 61. The strength of the coupling or from the transmission interference suppression antennas 60, 61 may then be adjusted, for example, by the size of the impedances, which are shown by the cones that are arranged in the outer end rings of the transmission interference suppression antennas 60, 61 that face away from the body coil 14.

In accordance with the present embodiments, embodiments in which the transmission interference suppression antennas 60, 61 have a number of feed points for supplying the interference suppression signals and these are partially passively generated and partially actively may be provided.

Figure 4:
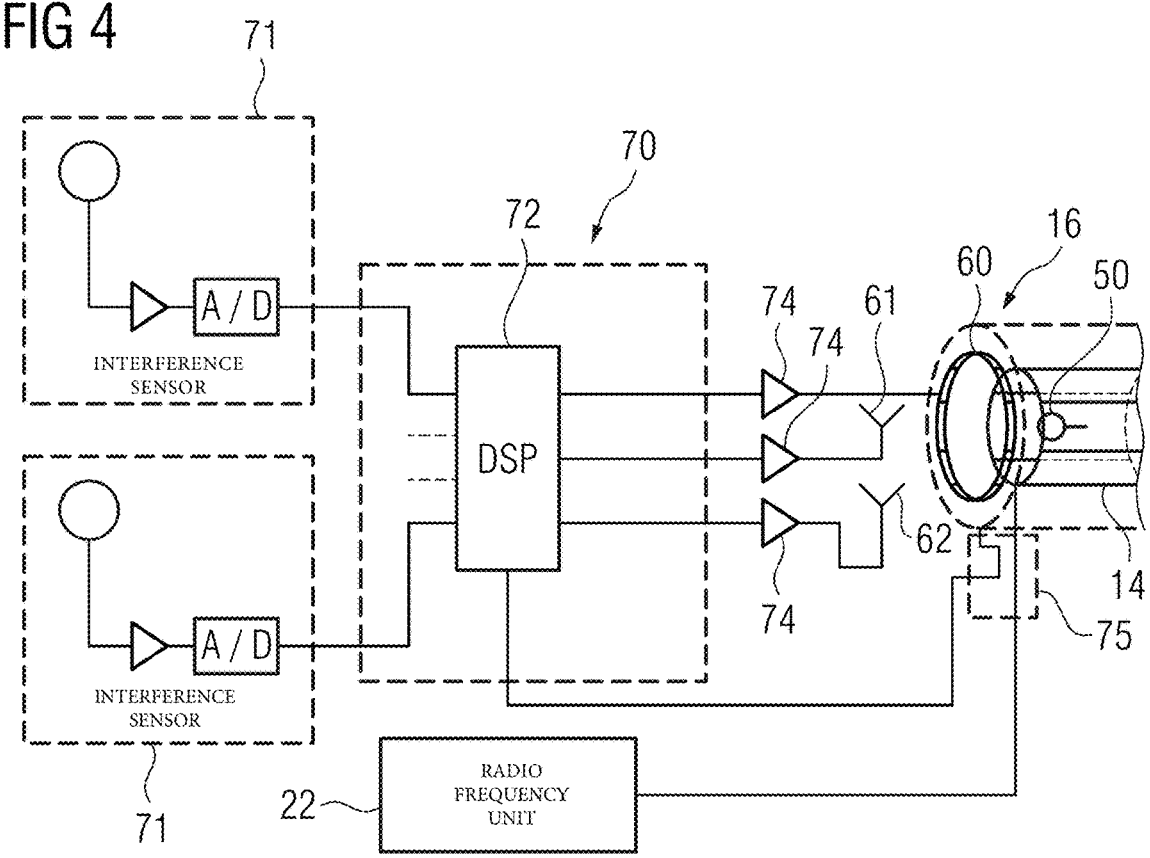
FIG. 4 shows a schematic representation of a transmission interference suppression apparatus.

One possibility is shown in FIG. 4, as in an embodiment where the interference suppression signal is provided actively by the transmitter.

The transmitter or the radio frequency unit 22 has for this purpose a transmission interference suppression facility 70. The transmission interference suppression controller 72 may be realized as, for example, a functional unit of the transmitter, also in software, or as a dedicated hardware. Analog or digital techniques may be used (e.g., digital signal processors (DSP), FPGA or also analog amplifier, filters or networks).

In the exemplary embodiment in FIG. 4, the transmission interference suppression controller 72 of the transmission interference suppression facility 70 obtains signals with information about the excitation signals emitted by the body coil 14 from the directional coupler 75. The transmission interference suppression controller 72 as a generator of signals already itself obtains information about the emitted interference suppression signals (e.g., if the amplification of the radio frequency amplifier 74 is known) that amplify the signal for the transmission interference suppression antennas 60, 61, 62. In one embodiment, directional couplers or simple, inductive, capacitive, or ohmic couplers may, for example, likewise receive the interference suppression signal for the transmission interference suppression controller 72 in order to take into account deviations in the transmission path. The transmission interference suppression antennas 61 and 62 are only shown symbolically for the sake of simplicity.

In one embodiment, only the excitation signal or the interference suppression signal is emitted and received by the interference sensors 71 initially in order to determine a transmission function in each case in a calibration phase in order then to determine a damping and a phase shift between interference senor 71 and body coil 14 or transmission interference suppression sensor 60, 61, 62 by the transmission interference suppression controller 72. In FIG. 4, digital interference sensors 71 that already digitalize the received signals and transmit information digitally to the transmission interference suppression controller 72 are shown. An analog transmission with analog interference sensors 71 may likewise be provided, however.

Further, the transmission interference suppression controller 72 obtains information relating to the excitation signal, in FIG. 4 about directional coupler 75, that is arranged on the feed point of the body coil 14 in order to detect as accurate an image of the currents through the body coil 14 as possible and thus the emitted alternating fields. In one embodiment, a portion of the coupling signal is decoupled with a voltage divider, or the portion of the coupling signal is extracted directly from information to generate the excitation signal.

With the transmission function between body coil 14 and interference sensor 71, the interference suppression controller 72 may determine an interference signal to be expected for an excitation signal at the interference sensor 71, and by the inverse transmission function between interference sensor 71 and transmission interference suppression antenna 60, 61, 62 also being applied thereto, also an inverse interference suppression signal to be emitted.

In one embodiment, with a plurality of transmission interference suppression antennas 60, 61, 62 and interference sensors 71, the energy of the resulting alternating field at the interference sensor 71 may be minimized while simultaneously emitting the excitation signal and the interference suppression signal or signals using linear optimization. Variable parameters may be a phase shift and a damping or amplification of the excitation signal in order to determine therefrom the respective interference suppression signal for a transmission interference suppression antenna 60, 61, 62. This may take place both in the calibration phase, in order to determine a start value for the parameters, but also during an image acquisition, in order to respond to changed propagation conditions by the patient.

Figure 5:
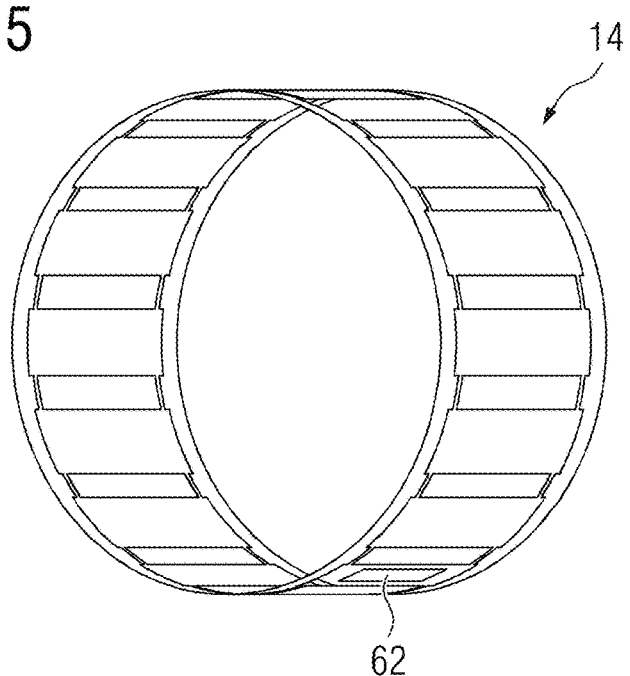
FIG. 5 shows a schematic representation of a further possible embodiment of the body coil with a third transmission interference suppression antenna.

FIG. 5 shows a third transmission interference suppression antenna 62 that is arranged as, for example, a planar electrode in the patient tunnel within the body coil 14. The third transmission interference suppression antenna 62 is likewise supplied with an interference suppression signal by the transmission interference suppression facility 70. Since the patient 100 has a low conductivity compared with the elements of the body coil, the induced currents are minimal, but electrical alternating fields nevertheless predominantly develop, which are also routed along the body out of the patient tunnel. With corresponding control, the electrode is enabled, by the transmission interference suppression controller, to generate electrical alternating fields for compensation that are directly opposite via induction and magnetic fields, and to couple the electrical alternating fields into the patient 100. Aside from the electrodes shown, the third transmission interference suppression antenna may, however, be any other type of antenna that is able to generate suitable electrical alternating fields.

FIG. 6 shows a schematic plan view of an embodiment of the method.

In act S10, an excitation signal is emitted by the magnetic resonance tomography system 1 from the radio frequency unit 22 via the body coil 14. This is an excitation pulse of an imaging sequence for exciting the nuclear spins to be detected.

In act S20, a first interference suppression signal is simultaneously emitted by the transmission interference suppression facility 70 via the first transmission interference suppression antenna 60. In one embodiment, interference suppression signals may be simultaneously emitted via the second transmission interference suppression antenna 61 and/or 62. The interference suppression signals may be pre-set signals or, according to a predetermined rule, derived from the excitation signal. The interference suppression signals are configured, for example, to reduce the excitation signal while simultaneously emitting to at least one predetermined location outside of the magnetic resonance tomography system 1 as a result of destructive interference.

In an embodiment of the method, the magnetic resonance tomography system 1 also has an interference sensor 71. In a further act S30, an interference signal is detected with the interference sensor 71. In a further act S40, the transmission interference suppression facility 70 determines, using the magnetic resonance tomography system 1, a modified first interference suppression signal as a function of the detected interference signal. The modified interference suppression signal is configured to reduce energy of the interference signal. This may be achieved, as already shown, for example, by modeling the signal propagation or by applying transfer functions to the excitation signal and the received interference signal.

In act S50, the acts S10 of emitting the excitation signal and S20 simultaneously emitting the interference suppression signal are finally carried out with the modified first interference suppression signal.

In one embodiment, these acts may be iteratively repeated a number of times in order to improve the interference suppression (e.g., in a calibration phase before the measurement, in which transmission takes place without the patient 100, is the patient 100 thus being protected against a SAR load). Alternatively, all signals may also be scaled by a shared factor in order to calibrate with a low output and then to raise all signals by the same factor during the image acquisition. On account of the linearity, the damping of the interference is therefore retained.

Although the invention has been illustrated and described in detail by the exemplary embodiments, the invention is not restricted by the disclosed examples, and other variations may be derived herefrom by the person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography system comprising:
a transmitter operable to generate an excitation signal;
a magnet unit having a body coil operable to emit the excitation signal and a patient tunnel that extends along a longitudinal axis through the magnet unit, the body coil surrounding the patient tunnel; and
a first transmission interference suppression antenna that is arranged inside the magnet unit next to the body coil along the longitudinal axis, such that the first transmission interference suppression antenna is axially arranged between the body coil and an opening in the patient tunnel, wherein the first transmission interference suppression antenna and the body coil are bird cage antennas;
wherein the first transmission interference suppression antenna is configured to provide a spatial transmission characteristic that is comparable with the body coil due to the arrangement of the first transmission interference suppression antenna and the body coil, such that a first interference suppression signal emitted by the first transmission interference antenna reduces an energy and field strength of the excitation signal being emitted out of the patient tunnel.

2. The magnetic resonance tomography system of claim 1, further comprising:

a second transmission interference suppression antenna,
wherein the body coil is arranged along the longitudinal axis of the patient tunnel between the first transmission interference suppression antenna and the second transmission interference suppression antenna.

3. The magnetic resonance tomography system of claim 2, wherein the first transmission interference suppression antenna and the body coil are bird cage antennas.

4. The magnetic resonance tomography system of claim 1, wherein the first transmission interference suppression antenna and the body coil have shared electrical conductors.

5. The magnetic resonance tomography system of claim 3, wherein the first transmission interference suppression antenna and the body coil have shared electrical conductors.

6. The magnetic resonance tomography system of claim 1, wherein the transmitter is configured to control the first transmission interference suppression antenna on a first signal supply with the first interference suppression signal as a function of the excitation signal.

7. The magnetic resonance tomography system of claim 3, wherein the transmitter is configured to control the first transmission interference suppression antenna on a first signal supply with the first interference suppression signal as a function of the excitation signal.

8. The magnetic resonance tomography system of claim 4, wherein the transmitter is configured to control the first transmission interference suppression antenna on a first signal supply with the first interference suppression signal as a function of the excitation signal.

9. The magnetic resonance tomography system of claim 8, wherein the magnetic resonance tomography system is configured to generate the first interference suppression signal with (i) a predetermined damping, (ii) phase shift, or (iii) predetermined damping and phase shift from the excitation signal.

10. The magnetic resonance tomography system of claim 6, wherein the magnetic resonance tomography system is configured to generate the first interference suppression signal with (i) a predetermined damping, (ii) phase shift, or (iii) predetermined damping and phase shift from the excitation signal.

11. The magnetic resonance tomography system of claim 4, further comprising an interference sensor,
wherein the first interference suppression antenna includes a second signal supply, and the magnetic resonance tomography system is configured to control the first transmission interference suppression antenna via the second signal supply with a second interference suppression signal, and
wherein the magnetic resonance tomography system is configured to generate the second interference suppression signal as a function of a signal of the interference sensor.

12. The magnetic resonance tomography system of claim 5, further comprising an interference sensor,
wherein the first interference suppression antenna includes a second signal supply, and the magnetic resonance tomography system is configured to control the first transmission interference suppression antenna via the second signal supply with a second interference suppression signal, and
wherein the magnetic resonance tomography system is configured to generate the second interference suppression signal as a function of a signal of the interference sensor.

13. The magnetic resonance tomography system of claim 7, further comprising an interference sensor,
wherein the first interference suppression antenna includes a second signal supply, and the magnetic resonance tomography system is configured to control the first transmission interference suppression antenna via the second signal supply with a second interference suppression signal, and
wherein the magnetic resonance tomography system is configured to generate the second interference suppression signal as a function of a signal of the interference sensor.

14. The magnetic resonance tomography system of claim 2, wherein the magnetic resonance tomography system is configured to control the first transmission interference suppression antenna with a second interference suppression signal,
wherein the magnetic resonance tomograph system further comprises a third transmission interference suppression antenna that has a monopoly characteristic, and
wherein the magnetic resonance tomography system is configured to control the third transmission interference suppression antenna with a third interference suppression signal.

15. The magnetic resonance tomography system of claim 3, wherein the magnetic resonance tomography system is configured to control the first transmission interference suppression antenna with a second interference suppression signal,
wherein the magnetic resonance tomograph system further comprises a third transmission interference suppression antenna that has a monopoly characteristic, and
wherein the magnetic resonance tomography system is configured to control the third transmission interference suppression antenna with a third interference suppression signal.

16. A method for operating a magnetic resonance tomography system, wherein the magnetic resonance tomography system comprises a magnet unit having a body coil surrounding a patient tunnel, the patient tunnel extending along a longitudinal axis through the magnet unit, and a first transmission interference suppression antenna, wherein the first transmission interference suppression antenna is arranged inside the magnet unit next to the body coil along the longitudinal axis, such that the first transmission interference suppression antenna is axially arranged between the body coil and an opening in the patient tunnel, wherein the first transmission interference suppression antenna and the body coil are bird cage antennas; the method comprising:
emitting, by the magnetic resonance tomography system, via the body coil, an excitation signal;
simultaneously emitting a first interference suppression signal via the first transmission interference suppression antenna to reduce an energy and field strength of the excitation signal being emitted out of the patient tunnel; and
providing, by the first transmission interference suppression antenna, a spatial transmission characteristic that is comparable with the body coil of the magnetic resonance tomography system due to the arrangement of the first transmission interference suppression antenna and the body coil.

17. The method of claim 16, wherein the magnetic resonance tomography system further comprises an interference sensor,
wherein the method further comprises:

detecting an interference signal with the interference sensor;

determining, by the magnetic resonance tomography system, a modified first interference suppression signal as a function of the detected interference signal, wherein the modified first interference suppression signal is configured to reduce an energy of the interference signal;

repeating the emitting of the excitation signal and the emitting of the first interference suppression signal with the modified first interference suppression signal.

18. The magnetic resonance tomography system of claim 1, wherein the spatial transmission characteristic comprises:
a symmetry in relation to a plane, an axis, or a point; or
a polarization characteristic.

19. The magnetic resonance tomography system of claim 1, wherein the spatial transmission characteristic comprises a spatial distribution of an electromagnetic field irradiated by the first transmission interference suppression antenna.

* * * * *